United States Patent
Park et al.

(10) Patent No.: US 9,614,015 B2
(45) Date of Patent: Apr. 4, 2017

(54) METHOD FOR FABRICATING DISPLAY DEVICE AND DISPLAY DEVICE

(71) Applicant: SAMSUNG DISPLAY CO., LTD., Yongin, Gyeonggi-Do (KR)

(72) Inventors: Seungwon Park, Seoul (KR); Baek Hee Lee, Yongin-si (KR); Manseob Choi, Hwaseong-si (KR); Minhyuck Kang, Seoul (KR); Moongyu Lee, Suwon-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/704,002

(22) Filed: May 5, 2015

(65) Prior Publication Data

US 2016/0155784 A1    Jun. 2, 2016

(30) Foreign Application Priority Data

Dec. 2, 2014    (KR) .......................... 10-2014-0170666

(51) Int. Cl.
*H01L 29/18*    (2006.01)
*H01L 27/32*    (2006.01)
(Continued)

(52) U.S. Cl.
CPC .......... *H01L 27/3246* (2013.01); *G03F 7/004* (2013.01); *H01L 51/5209* (2013.01);
(Continued)

(58) Field of Classification Search
CPC . H01L 51/5209; H01L 51/5225; H01L 51/56; H01L 27/3246
(Continued)

(56) References Cited

U.S. PATENT DOCUMENTS

2004/0222740 A1* 11/2004 Kim .................... H01L 27/3244
                                                                313/506
2006/0097263 A1*  5/2006 Lee .................... H01L 27/3246
                                                                257/72
(Continued)

FOREIGN PATENT DOCUMENTS

JP    2009-292703 A    12/2009
JP    2013-165151 A     8/2013
(Continued)

OTHER PUBLICATIONS

Frank S. Bates et al., "Block Copolymers-Designer Soft Materials", Physics Today, Feb. 1999, pp. 32-38.

*Primary Examiner* — Trung Q Dang
(74) *Attorney, Agent, or Firm* — Lee & Morse, P.C.

(57) ABSTRACT

A method for fabricating a display device includes forming a thin film transistor on a base substrate, forming a first electrode connected to the thin film transistor, forming a pixel defining layer overlapping a portion of the first electrode, such that the pixel defining layer exposes a portion of the first electrode and partitions pixel areas, forming a block copolymer layer on the first electrode and the pixel defining layer, patterning the block copolymer layer, etching the pixel defining layer by using the patterned block copolymer layer as a mask, such that an uneven pixel defining layer with a plurality of defining layer grooves is formed, and forming a light emitting layer on the first electrode and the uneven pixel defining layer.

23 Claims, 10 Drawing Sheets

(51) Int. Cl.
*H01L 51/52* (2006.01)
*G03F 7/004* (2006.01)

(52) U.S. Cl.
CPC ...... *H01L 51/5225* (2013.01); *H01L 51/5268* (2013.01); *H01L 2227/323* (2013.01)

(58) Field of Classification Search
USPC .................................................. 257/88, 89
See application file for complete search history.

(56) References Cited

U.S. PATENT DOCUMENTS

| | | | |
|---|---|---|---|
| 2013/0187163 A1* | 7/2013 | Kim ................... | H01L 51/5271 |
| | | | 257/59 |
| 2015/0060826 A1* | 3/2015 | Matsumoto ......... | H01L 27/3246 |
| | | | 257/40 |
| 2015/0069361 A1* | 3/2015 | Sato ................... | H01L 51/0015 |
| | | | 257/40 |
| 2015/0115217 A1 | 4/2015 | Cho et al. | |

FOREIGN PATENT DOCUMENTS

| | | | |
|---|---|---|---|
| JP | 2014-022550 A | 2/2014 |
| KR | 2002-0087273 A | 11/2002 |
| KR | 2008-0067406 A | 7/2008 |
| KR | 10-2015-0031102 A | 3/2015 |
| KR | 10-2015-0042937 A | 4/2015 |
| KR | 10-2015-0118662 | 10/2015 |

* cited by examiner

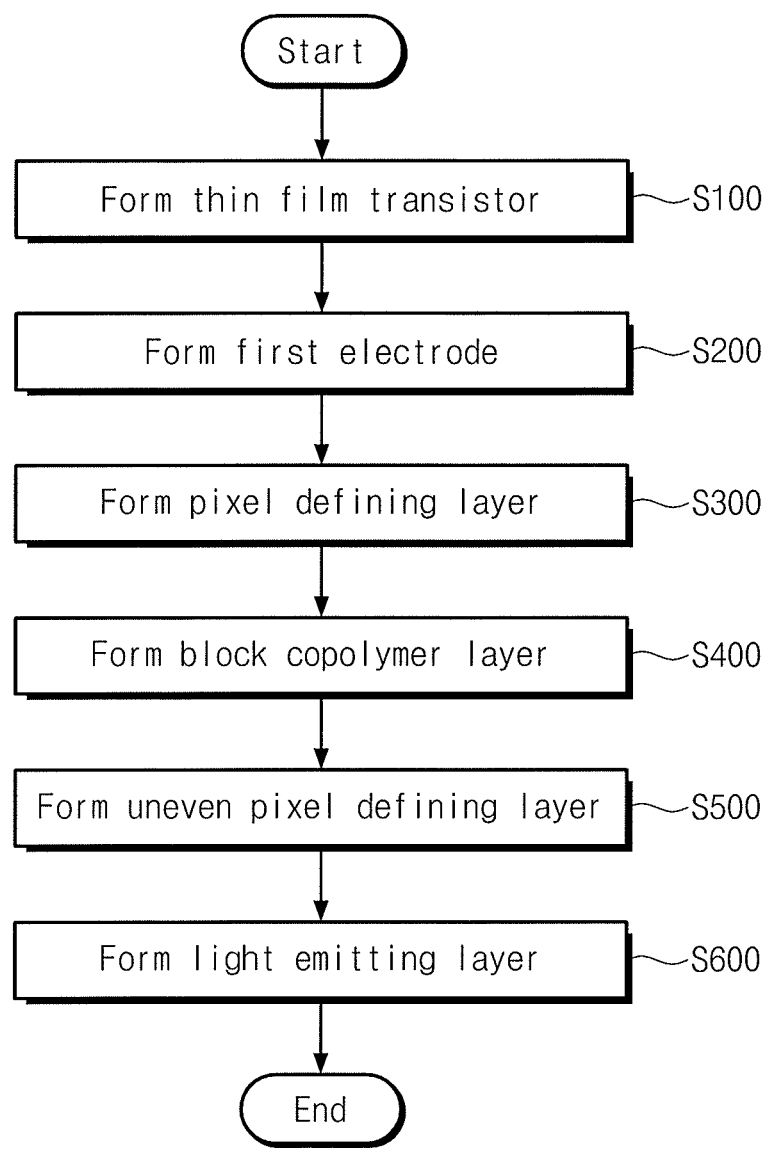

METHOD FOR FABRICATING DISPLAY DEVICE AND DISPLAY DEVICE

CROSS-REFERENCE TO RELATED APPLICATION

Korean Patent Application No. 10-2014-0170666, filed on Dec. 2, 2014, in the Korean Intellectual Property Office, and entitled: "Method For Fabricating Display Device And Display Device," is incorporated by reference herein in its entirety.

BACKGROUND

1. Field

The present disclosure herein relates to a method for fabricating a display device and a display device, and more particularly, to a method for fabricating a display device, which is capable of improving display quality, and a display device.

2. Description of the Related Art

Flat display devices may be classified into light-emitting type display devices and light-receiving type display devices. The light-emitting type display devices include, e.g., flat cathode ray tube (FCRT) displays, plasma display panels (PDPs), and organic light emitting diode (OLED) displays.

For example, the OLED display is an emissive display device and has a wide viewing angle, excellent contrast, and fast response speed. Accordingly, since the OLED display is implemented in mobile devices, e.g., a digital camera, a video camera, a portable information terminal, a smart phone, an ultra slim notebook computer, a tablet personal computer, and a flexible display device or in large scale electrical/electronic products, e.g., an ultra thin television, it receives great attentions.

The OLED display may realize colors by using a principle in which holes and electrons, which are injected into first and second electrodes, are recombined with each other to emit light. That is, when excitons, in which the injected holes and electrons are combined with each other, return from an excited state to a ground state, light may be emitted.

SUMMARY

Embodiments provide methods for fabricating a display device, including forming a thin film transistor on a base substrate, forming a first electrode connected to the thin film transistor, forming a pixel defining layer overlapping a portion of the first electrode, such that the pixel defining layer exposes a portion of the first electrode and partitions pixel areas, forming a block copolymer layer on the first electrode and the pixel defining layer, patterning the block copolymer layer, etching the pixel defining layer by using the patterned block copolymer layer as a mask, such that an uneven pixel defining layer with a plurality of defining layer grooves is formed, and forming a light emitting layer on the first electrode and the uneven pixel defining layer.

In some embodiments, the forming of the uneven pixel defining layer may include forming the uneven pixel defining layer so that the defining layer grooves are formed to be spaced a predetermined interval from each other.

In other embodiments, the forming of the uneven pixel defining layer may include forming the uneven pixel defining layer so that the defining layer grooves have a uniform depth.

In still other embodiments, the forming of the uneven pixel defining layer may include forming the uneven pixel defining layer so that the defining layer grooves are formed in a top surface of the uneven pixel defining layer and are not formed in a bottom surface of the uneven pixel defining layer.

In even other embodiments, the forming of the uneven pixel defining layer may include: patterning the block copolymer layer to form a block copolymer pattern; and etching the pixel defining layer by using the block copolymer pattern as a mask to form the uneven pixel defining layer having the defining layer grooves.

In yet other embodiments, the forming of the block copolymer pattern may be performed by providing ozone, oxygen plasma, and UV.

In further embodiments, the forming of the block copolymer layer may be performed by using a block copolymer including first repeating units and second repeating units different from the first repeating units.

In still further embodiments, the forming of the block copolymer pattern may include: rearranging the first repeating units and the second repeating units to form a self-assembly structure in which the first repeating units and the second repeating units are alternately arranged; and removing the first repeating units to form the block copolymer pattern.

In even further embodiments, the forming of the self-assembly structure may be performed through thermal processing or solvent annealing.

In yet further embodiments, in the forming of the self-assembly structure, the block copolymer may be self-assembled with a sphere, cylinder, lamellar, gyroid, or hexagonal perforated cylinder (HPL) structure.

In much further embodiments, the forming of the uneven pixel defining layer may include: etching the pixel defining layer by using the second repeating units as a mask; and removing the second repeating units.

In still much further embodiments, the etching of the pixel defining layer may be performed so that the pixel defining layer is etched, and the first electrode is not etched.

In even much further embodiments, the removing of the second repeating units may include removing the second repeating units disposed on the first electrode and the uneven pixel defining layer.

In yet much further embodiments, the forming of the uneven pixel defining layer may include exposing the portion of the first electrode.

In much still further embodiments, the forming of the first electrode may be performed so that the first electrode does not have grooves.

In even still further embodiments, the methods may further include forming a second electrode on the uneven pixel defining layer and the light emitting layer. The second electrode may include a uneven second electrode having electrode grooves and a second even electrode extending from the second even electrode and which does not have the electrode grooves.

In other embodiments, display devices include a base substrate; and a plurality of pixels, wherein at least one of the pixels includes a thin film transistor disposed on the base substrate; a first electrode connected to the thin film transistor; an uneven pixel defining layer that overlaps a portion of the first electrode and has a plurality of defining layer grooves; a light emitting layer disposed on the first electrode and the uneven pixel defining layer; and a second electrode including a uneven second electrode having electrode grooves and a second even electrode extending from the uneven second electrode and which does not have the electrode grooves, the second electrode being disposed on the light emitting layer.

In some embodiments, the first electrode may not have grooves.

In other embodiments, the defining layer grooves may be defined in a top surface of the uneven pixel defining layer and may not be defined in a bottom surface of the uneven pixel defining layer.

In still other embodiments, the defining layer grooves may be only on surfaces of the pixel defining layer facing the second electrode, the defining layer grooves being spaced apart from each other and having a predetermined depth in the pixel defining layer.

BRIEF DESCRIPTION OF THE DRAWINGS

Features will become apparent to those of ordinary skill in the art by describing in detail exemplary embodiments with reference to the attached drawings, in which:

FIG. 5 illustrates a schematic flowchart of a method for fabricating a display device according to an embodiment;

DETAILED DESCRIPTION

Figure 1:
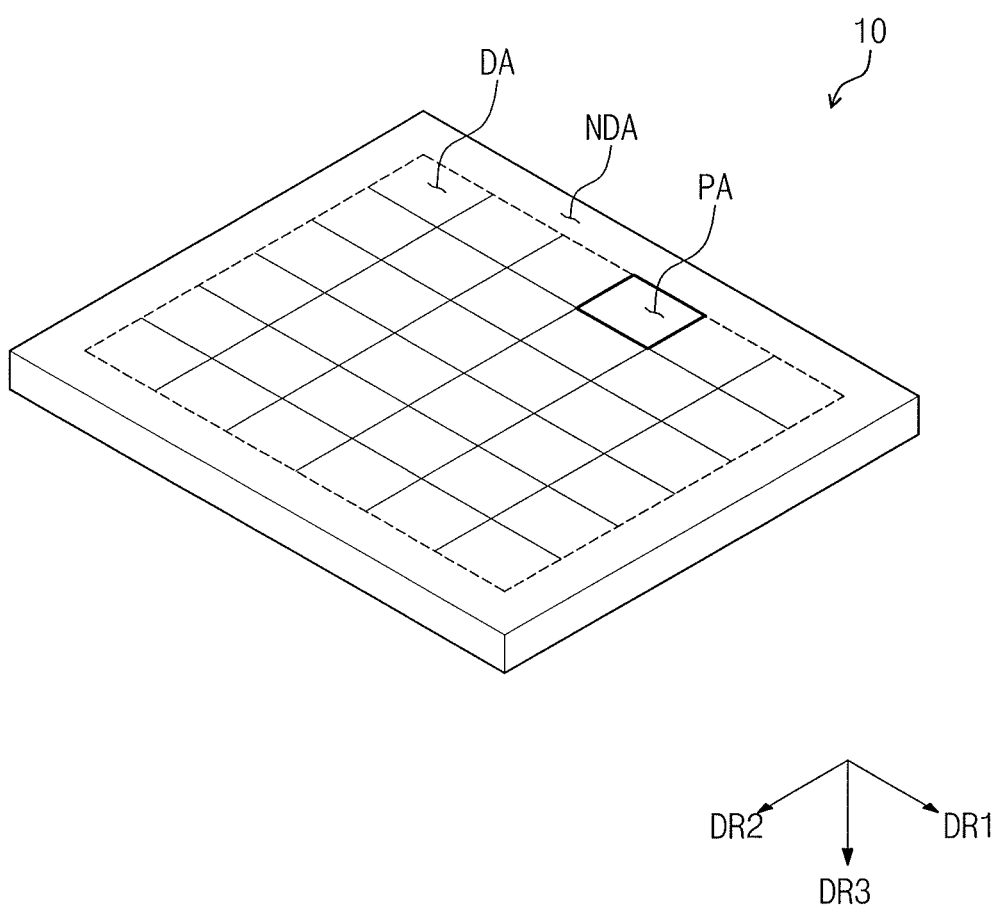
FIG. 1 illustrates a schematic perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that although the terms "first" and "second" are used herein to describe various elements, these elements should not be limited by these terms. The terms are only used to distinguish one component from other components. For example, a first element referred to as a first element in one embodiment can be referred to as a second element in another embodiment. The terms of a singular form may include plural forms unless referred to the contrary.

The meaning of 'include' or 'comprise' specifies a property, a region, a fixed number, a step, a process, an element and/or a component but does not exclude other properties, regions, fixed numbers, steps, processes, elements and/or components. In the specification, it will be understood that when a layer (or film), a region, or a plate is referred to as being 'on' another layer, region, or plate, it can be directly on the other layer, region, or plate, or intervening layers, regions, or plates may also be present. On the contrary to this, it will be understood that when a layer (or film), a region, or a plate is referred to as being 'under' another layer, region, or plate, it can be directly under the other layer (or film), region, or plate, or intervening layers, regions, or plates may also be present.

FIG. 1 illustrates a schematic perspective view of a display device 10 according to an embodiment.

Referring to FIG. 1, the display device 10 according to an embodiment may include a display area DA and a non-display area NDA. An image is displayed on the display area DA. When viewed in a thickness direction, e.g., in the DR3 direction in FIG. 1, of the display device 10, the display area DA may have an approximately rectangular shape, but is not limited thereto.

The display area DA includes a plurality of pixel areas PA. The plurality of pixel areas PA may be arrayed in a matrix form. The plurality of pixel areas PA may be defined by an uneven pixel defining layer (B-PDL in FIG. 4). A plurality of pixels (PX in FIG. 2) may be disposed on the plurality of pixel areas PA, respectively.

An image is not displayed on the non-display area NDA. For example, the non-display area may surround the display area DA.

Figure 2:
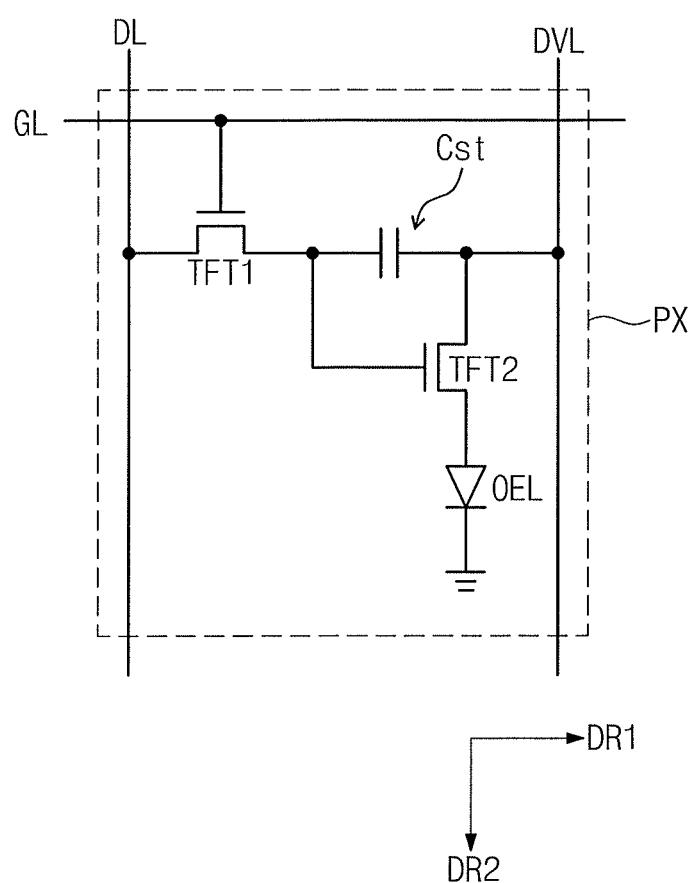
FIG. 2 illustrates a circuit view of one of the pixels in the display device according to an embodiment.
Figure 3:
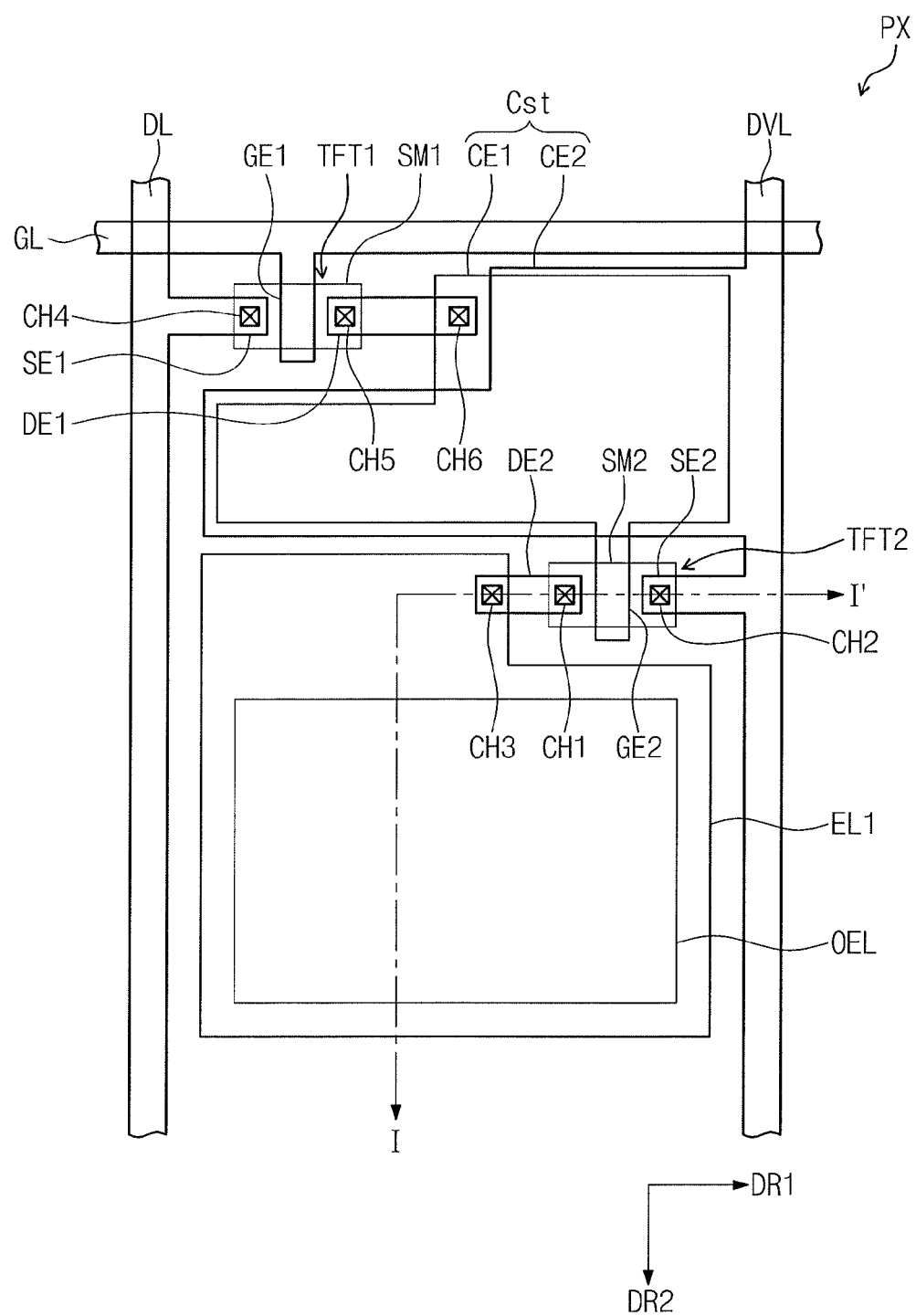
FIG. 3 illustrates a plan view of one of the pixels in the display device according to an embodiment.

FIG. 2 illustrates a circuit diagram of one of the pixels PX in the display device 10. FIG. 3 illustrates a plan view of one of the pixels PX in the display device 10, and FIG. 4 illustrates a schematic cross-sectional view taken along line I-I' of FIG. 3.

Figure 4:
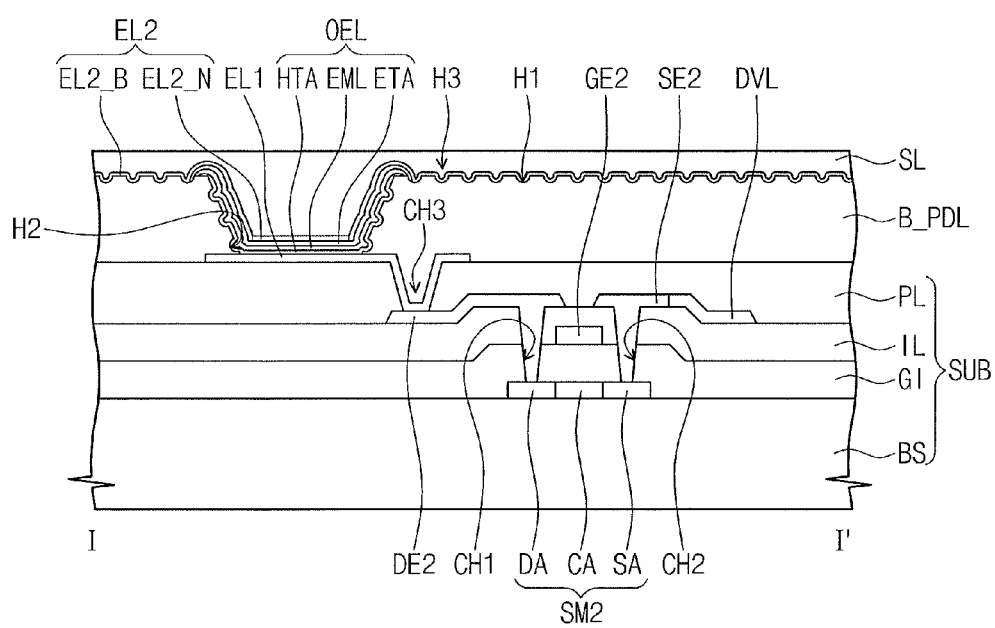
FIG. 4 illustrates a schematic cross-sectional view taken along line I-I' of FIG. 3.

Referring to FIGS. 2 to 4, each of the pixels PX includes a wiring unit constituted by a gate line GL, a data line DL, and a driving voltage line DVL, thin film transistors TFT1 and TFT2 connected to the wiring unit, an organic emitting light device OEL connected to the thin film transistors TFT1 and TFT2, and a capacitor Cst.

Each of the pixels PX may emit light having a specific color, e.g., one of red light, green light, and blue light. The color of emitted light is not limited to the above-described light. For example, the color of emitted light may further include, e.g., cyan light, magenta light, and yellow light.

The gate line GL extends in a first direction, e.g., a DR1 direction in FIGS. 1 and 3. The data line DL extends in a second direction, e.g., a DR2 direction in FIGS. 1 and 3, that crosses the gate line GL. The driving voltage line DVL extends in a substantially same direction as the data line DL, e.g., in the second direction DR2 of FIG. 1. The gate line GL transmits a scanning signal into the thin film transistors TFT1 and TFT2, the data line DL transmits a data signal into the thin film transistors TFT1 and TFT2, and the driving voltage line DVL provides a driving voltage into the thin film transistors TFT1 and TFT2.

The thin film transistors TFT1 and TFT2 may include a driving thin film transistor TFT2 for controlling the organic light emitting device OEL, and a switching thin film transistor TFT1 for switching the driving thin film transistor TFT2. Each of the pixels PX includes the two thin film transistors TFT1 and TFT2 in an embodiment, but is not limited thereto. For example, each of the pixels PX may include one thin film transistor and capacitor or may include at least three thin film transistors and at least two capacitors.

Referring to FIG. 3, the switching thin film transistor TFT1 includes a first gate electrode GE1, a first source electrode SE1, and a first drain electrode DE1. The first gate electrode GE1 is connected to the gate line GL, and the first source electrode SE1 is connected to the data line DL. The first drain electrode DE1 is connected to a first common electrode CE1 by a fifth contact hole CH5. The switching thin film transistor TFT1 transmits the data signal applied into the data line DL into the driving thin film transistor TFT2 according to the scanning signal applied into the gate line GL.

The driving thin film transistor TFT2 includes a second gate electrode GE2, a second source electrode SE2, and a second drain electrode DE2. The second gate electrode GE2 is connected to the first common electrode CE1. The second source electrode SE2 is connected to the driving voltage line DVL. The second drain electrode DE2 is connected to the first electrode EL1 by a third contact hole CH3.

The organic light emitting device OEL is disposed between the first electrode EL1 and the second electrode EL2. The first electrode EU is connected to the second drain electrode DE2 of the driving thin film transistor TFT2. When a common voltage is applied to the second electrode EL2, a light emitting layer EML emits blue light according to an output signal of the driving thin film transistor TFT2 to display an image. The organic light emitting device OEL, the first electrode EL1, and the second electrode EL2 will be described below in more detail.

The capacitor Cst is connected between the second gate electrode GE2 and the second source electrode SE2 of the driving thin film transistor TFT2 to charge and maintain the data signal inputted into the second gate electrode GE2 of the driving thin film transistor TFT2. The capacitor Cst may include the first common electrode CE1 connected to the first drain electrode DE1 by a sixth contact hole CH6 and a second common electrode CE2 connected to the driving voltage line DVL.

Referring to FIGS. 3 and 4, the display device 10 according to an embodiment may include a base substrate BS, on which the thin film transistor and the organic light emitting device OEL are stacked. The base substrate BS may be formed of any suitable material. For example, the base substrate BS may be formed of an insulating material, e.g., glass, plastic, crystal. An organic polymer for forming the base substrate BS may include, e.g., polyethylene terephthalate (PET), polyethylene naphthalate (PEN), polyimide, and polyether sulfone. The base substrate BS may be selected in consideration of mechanical strength, thermal stability, transparency, surface roughness, tractability, waterproofing property, and the like.

A substrate buffer layer may be disposed on the base substrate BS. The substrate buffer layer may prevent impurities from being diffused into the switching thin film transistor TFT1 and the driving thin film transistor TFT2. The substrate buffer layer may be formed of, e.g., $SiN_x$, $SiO_x$, or $SiO_xN_y$. Also, the substrate buffer layer may be omitted according to the material and process conditions of the base substrate BS.

A first semiconductor layer SM1 and a second semiconductor layer SM2 are disposed on the base substrate BS. Each of the first and second semiconductor layers SM1 and SM2 is formed of a semiconductor material. Also, the first and second semiconductor layers SM1 and SM2 may function as active layers of the switching and driving thin film transistors TFT1 and TFT2, respectively. Each of the first and second semiconductor layers SM1 and SM2 includes a source area SA, a drain area DA, and a channel area CA disposed between the source area SA and the drain area DA. Each of the first and second semiconductor layers SM1 and SM2 may be formed of one of an inorganic semiconductor and organic semiconductor. The source area SA and the drain area DA may be doped with n-type impurities or p-type impurities.

A gate insulation layer GI is disposed on the first and second semiconductor layers SM1 and SM2. The gate insulation layer GI covers the first and second semiconductor layers SM1 and SM2. The gate insulation layer GI may be formed of an organic insulation material or inorganic insulation material.

First and second gate electrode GE1 and GE2 are disposed on the gate insulation layer GI. Each of the first and second gate electrodes GE1 and GE2 covers an area corresponding to the channel area CA of each of the first and second semiconductor layers SM1 and SM2.

An interlayer dielectric IL is disposed on the first and second gate electrodes GE1 and GE2. The interlayer dielectric IL covers the first and second gate electrodes GE1 and GE2. The interlayer dielectric IL may be formed of an organic insulating material or inorganic insulating material.

The first source and drain electrodes SE1 and DE1 and the second source and drain electrodes SE2 and DE2 are disposed on the interlayer dielectric IL. The second drain electrode DE2 contacts the drain area DA of the second semiconductor layer SM2 by a first contact hole CH1 defined in the gate insulation layer GI and the interlayer dielectric IL, and the second source electrode SE2 contacts the source area SA of the second semiconductor layer SM2 by a second contact hole Ch2 defined in the gate insulation layer GI and the interlayer dielectric IL. The first source electrode SE1 contacts a source area of the first semiconductor layer SM1 by a fourth contact hole CH4 defined in the gate insulation layer GI and the interlayer dielectric IL, and the first drain electrode DE1 contacts a drain area of the first semiconductor layer SM1 by a fifth contact hole CH5 defined in the gate insulation layer GI and the interlayer dielectric IL.

A passivation layer PL is disposed on the first source and drain electrodes SE1 and DE1 and the second source and drain electrodes SE2 and DE2. The passivation layer PL may function as a protection layer for protecting the switching thin film transistor TFT1 and the driving thin film transistor TFT 2 and also function as a planarization layer for planarizing top surfaces of the switching thin film transistor TFT1 and the driving thin film transistor TFT 2.

The first electrode EL1 is disposed on the passivation layer PL. The first electrode EU may not have grooves.

For example, the first electrode EU may be a pixel electrode or positive electrode. The first electrode EL1 is connected to the driving thin film transistor TFT2. The first electrode EL1 is connected to the second drain electrode DE2 of the driving thin film transistor TFT2 through the third contact hole CH3 defined in the passivation layer PL.

The first electrode EU may be a transmissive electrode, a transflective electrode, or a reflective electrode. When the first electrode EL1 is the transmissive electrode, the first electrode EL1 may be formed of metal oxide, for example, indium tin oxide (ITO), indium zinc oxide (IZO), zinc oxide (ZnO), or indium tin zinc oxide (ITZO). When the first electrode EL1 is the transflective or reflective electrode, the first electrode EL1 may be formed of Ag, Mg, Al, Pt, Pd, Au, Ni, Nd, Ir, Cr, or a metal mixture.

The first electrode EL1 may have a single layer structure formed of transparent metal oxide or metal or a multi-layered structure including a plurality of layers. For example, the first electrode EL1 may have a single layer structure of ITO, Ag, or metal mixture, e.g., a mixture of Ag and Mg, a two-layered structure of ITO/Mg or ITO/MgF, or a three-layered structure of ITO/Ag/ITO, but is not limited thereto.

Figure 6A:
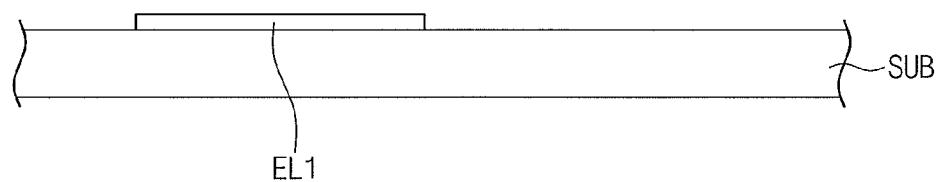
FIGS. 6A to 6G and 6I illustrate cross-sectional views of stages in a method for fabricating a display device according to an embodiment.
Figure 6B:
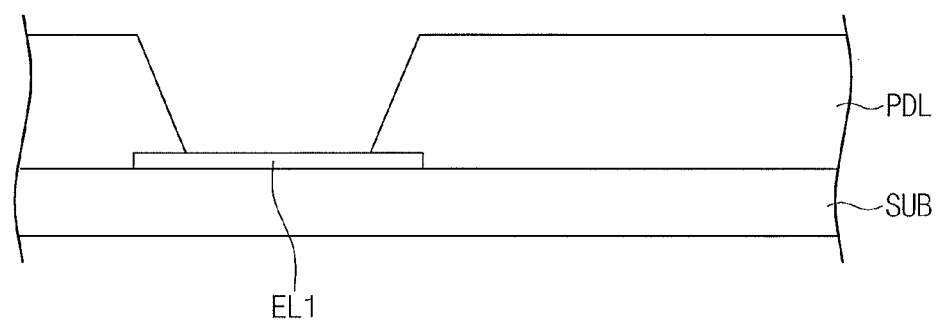
Figure 6C:
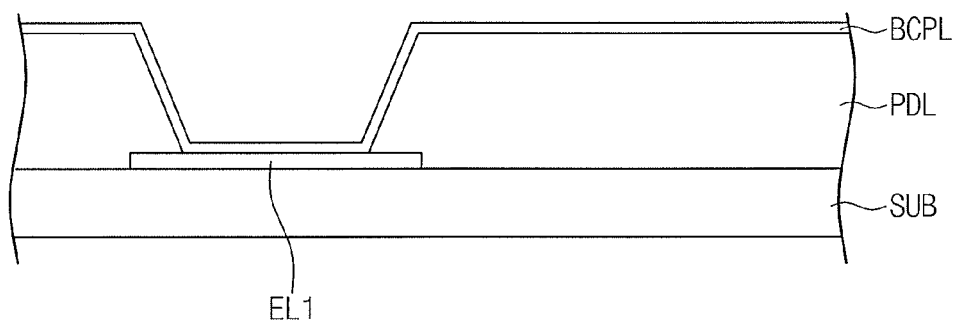
Figure 6D:
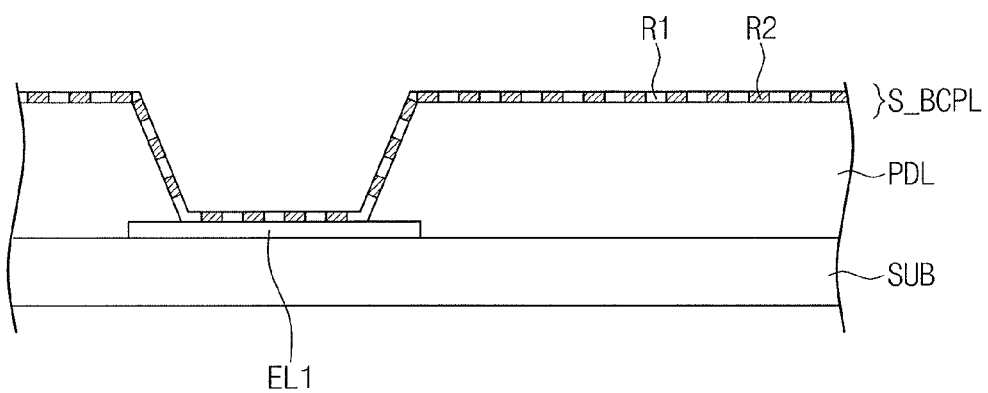

The pixel areas PA (FIG. 1) are partitioned on the passivation PL to correspond to the pixels PX, respectively. Also, the uneven pixel defining layer B_PDL having a plurality of defining layer grooves H1 and H2 is disposed on the passivation layer PL. The defining layer grooves H1 and H2 include top surface defining layer grooves H1 defined in a top surface of the uneven pixel defining layer B_PDL, and side surface defining layer grooves H2 defined in a side surface of the uneven pixel defining layer B_PDL. The defining layer grooves H1 and H2 are not defined in a bottom surface of the uneven pixel defining layer B_PDL. The defining layer grooves H1 and H2 may be formed by etching the pixel defining layer PDL (FIG. 6B) by using a portion of a block copolymer layer BCPL (FIG. 6C) disposed on the pixel defining layer PDL (FIG. 6B) as a mask, as will be discussed in more detail below.

If defining layer grooves are formed by using a general photolithography process, it may be difficult to form grooves with a fine structure having a size similar to that of a molecule. However, in the display device according to an embodiment, the uneven pixel defining layer B_PDL has fine defining layer grooves, each of which has a size similar to that of a molecule, by using the block copolymer BCPL. Also, the uneven pixel defining layer B_PDL having the defining layer grooves that are spaced a predetermined interval from each other may be formed through a relatively simple process.

Referring back to FIG. 4, the uneven pixel defining layer B_PDL exposes a top surface of the first electrode EL1 and protrudes from the base substrate BS along a circumference of each of the pixels PX. The uneven pixel defining layer B_PDL may overlap a portion of the first electrode EL1.

The uneven pixel defining layer B_PDL may include, but is not limited thereto, at least one of a polymer and a metal-fluorine ion compound. For example, the uneven pixel defining layer B_PDL may be formed of at least one of polyimide, LiF, $BaF_2$, and CsF. If the metal-fluorine ion compound has a predetermined thickness, the metal-fluorine ion compound may have an insulating property. For example, the uneven pixel defining layer B_PDL may have a thickness of about 0.1 μm to about 10 μm.

The organic light emitting device OEL is disposed on the pixel area PA (FIG. 1) that is surrounded by the uneven pixel defining layer B_PDL. The organic light emitting device OEL is disposed between the first electrode EU and the second electrode EL2. The organic light emitting device OEL may include an organic layer. The organic layer may be disposed on the first electrode EL1. The organic layer includes the light emitting layer EML. The organic layer may further include a hole transport area HTA and an electron transport area ETA.

The hole transport area HTA may be disposed on the first electrode EL1 and the uneven pixel defining layer B_PDL. The hole transport area HTA may contact the uneven pixel defining layer B_PDL. For example, the hole transport area HTA may contact the side surface defining layer groves H2 defined in the side surface of the uneven pixel defining layer B_PDL. The hole transport area HTA may include protrusions coupled to the side surface defining layer grooves H2.

The hole transport area HTA may include at least one of a hole injection layer, a hole transport layer, a buffer layer, and an electron stop layer, but is not limited thereto. The hole transport area HTA may have a single layer structure formed of a single material, a single layer structure formed of materials different from each other, or a multi-layered structure including a plurality of layers formed of materials different from each other.

For example, the hole transport area HTA may have a single layer structure formed of a plurality of different materials or a structure of the hole injection layer/the hole transport layer, the hole injection layer/the hole transport layer/the buffer layer, the hole injection layer/the buffer layer, the hole transport layer/the buffer layer, or the hole injection layer/the hole transport layer/the electron stop layer, which are successively stacked from the first electrode EL1, but is not limited thereto. The hole transport area HTA may be formed by using various methods, e.g., a vacuum deposition method, a spin coating method, a casting method, a Langmuir-Blodgett (LB) method, an inject printing method, a laser printing method, and a laser induced thermal imaging (LITI) method.

When the hole transport area HTA includes the hole injection layer, the hole transport area HTA may include a phthalocyanine compound, e.g., copper phthalocyanine, N,N'-diphenyl-N,N'-bis-[4-(phenyl-m-tolyl-amino)-phenyl]-biphenyl-4,4'-diamine (DNTPD), 4,4',4''-tris(3-methylphenylphenylamino)triphenylamine (m-MTDATA), 4,4'4''-Tris(N,N-diphenylamino)triphenylamine (TDATA), 4,4',4''-tris{N,-(2-naphthyl)-N-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonicacid (PANI/CSA), and polyaniline/poly(4-styrenesulfonate) (PANI/PSS), but is not limited thereto.

When the hole transport area HTA includes the hole transport layer, the hole transport area HTA may include a carbazole-based derivative, e.g., N-phenylcarbazole and polyvinylcarbazole, a fluorine-based derivative, a triphenylamine-based derivative such as N,N-bis(3-methylphenyl)-N,N'-diphenyl-[1,1-biphenyl]-4,4'-diamine (TPD) and 4,4',4''-tris(N-carbazolyl)triphenylamine (TCTA), N,N'-di (1-naphthyl)-N,N'-diphenylbenzidine (NPB), and 4,4'-Cyclohexylidene bis[N,N-bis(4-methylphenyl)benzenamine] (TAPC), but is not limited thereto.

The hole transport area HTA may have a thickness of about 100 Å to about 10,000 Å, e.g., about 100 Å to about 1,000 Å. When the hole transport area HTA includes both the hole injection layer and the hole transport layer, the hole injection layer may have a thickness of about 100 Å to about 10,000 Å, e.g., about 100 Å to about 1,000 Å, and the hole transport layer may have a thickness of about 50 Å to about 2,000 Å, e.g., about 100 Å to about 1,500 Å. When each of the hole transport area HTA, the hole injection layer, and the hole transport layer has a thickness within the above-described range, satisfactory hole transport characteristics may be achieved without substantially increasing in driving voltage.

The hole transport area HTA may further include a charge generating material in addition to the above-described materials to improve conductivity. The charge generating material may be uniformly or non-uniformly dispersed into the hole transport area HTA. For example, the charge generating material may be a p-dopant. The p-dopant may be one of a quinone derivative, a metal oxide derivative, a cyano-containing compound, but is not limited thereto. For example, according to a non-limiting example, the p-dopant may include a quinine derivative, e.g., tetracyanoquinodimethane (TCNQ) and 2,3,5,6-tetrafluoro-tetracyanoquinodimethane (F4-TCNQ), and metal oxide, e.g., tungsten oxide and molybdenum oxide, but is not limited thereto.

As described above, the hole transport area HTA may further include at least one of the buffer layer and the electron stop layer, in addition to the hole injection layer and the hole transport layer, but is not limited thereto. The buffer layer may compensate an optical resonance distance according to a wavelength of light emitted from the light emitting layer EML to improve light emission efficiency. A material that is capable of being contained in the hole transport area HTA may be used as a material to be contained in the buffer layer. The electron stop layer may be a layer for preventing electrons from being injected from the electron transport area ETA.

The light emitting layer EML may be disposed on the first electrode EL1. The light emitting layer EML may be disposed on the hole transport area HTA.

The light emitting layer EML may contact the hole transport area HTA and the uneven pixel defining layer B_PDL. For example, the light emitting layer EML may contact the side surface defining layer groves H2 defined in the side surface of the uneven pixel defining layer B_PDL. The light emitting layer EML may include protrusions coupled to the side surface defining layer grooves H2. Although not shown, the light emitting layer EML may extend to contact top surface defining layer grooves H1 disposed on the top surface of the uneven pixel defining layer B_PDL.

The light emitting layer EML may have a single layer structure formed of a single material, a single layer structure formed of materials different from each other, or a multi-layered structure including a plurality of layers formed of materials different from each other. The light emitting layer EML may be formed by using various methods, e.g., a vacuum deposition method, a spin coating method, a casting method, a Langmuir-Blodgett (LB) method, an inject printing method, a laser printing method, and a laser induced thermal imaging (LITI) method.

The light emitting layer EML may be any suitable material, e.g., the light emitting layer EML may be formed of materials that emit red, green, and blue colors. Alternatively, the light emitting layer may include a phosphor material and a fluorescent material. Also, the light emitting layer EML may include host or dopant.

The host may be any suitable material. For example, the host may be formed of tris(8-hydroxyquinolino)aluminum ($Alq_3$), 4,4'-bis(N-carbazolyl)-1,1'-biphenyl (CBP), poly(n-vinylcabazole) (PVK), 9,10-di(naphthalene-2-yl)anthracene (ADN), 4,4',4''-Tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), or 2-Methyl-9,10-bis(naphthalen-2-yl) anthracene (MADNP).

When the light emitting layer EML emits red light, the light emitting layer EML may include, for example, a phosphor material including tris(dibenzoylmethanato) phenanthoroline europium ($PBD:Eu(DBM)_3(Phen)$) and perylene. When the light emitting layer EML emits the red light, the dopant contained in the light emitting layer EML may be, e.g., a metal complex or an organometallic complex such as bis(1-phenylisoquinoline)acetylacetonate iridium (PIQIr(acac)), bis(1-phenylquinoline)acetylacetonate iridium (PQIr(acac)), PQIr(tris(1-phenylquinoline)iridium), octaethylporphyrin platinum (PtOEP).

When the light emitting layer EML emits green light, the light emitting layer EML may include, e.g., a fluorescent material including $Alq_3$(tris(8-hydroxyquinolino)aluminum. When the light emitting layer EML emits the green light, the dopant contained in the light emitting layer EML may be selected from, for example, a metal complex or organometallic complex such as $Ir(ppy)_3$(fac-tris(2-phenylpyridine) iridium.

When the light emitting layer EML emits blue light, the light emitting layer EML may include, e.g., a phosphor material including at least one of spiro-DPVBi, spiro-6P, distyryl-benzene (DSB), distyryl-arylene (DSA), polyfluorene (PFO)-based polymer or poly(p-phenylene vinylene (PPV)-based polymer. When the light emitting layer EML emits the blue light, the dopant contained in the light emitting layer EML may be, e.g., a metal complex or an organometallic complex, e.g., $(4,6-F_2ppy)_2Irpic$.

As described above, the organic layer may further include the electron hole transport area ETA. The electron transport area ETA may be disposed on the first electrode EL1 and the uneven pixel defining layer B_PDL. The electron transport area ETA may be disposed on the light emitting layer EML.

The electron transport area ETA may contact the light emitting layer EML and the uneven pixel defining layer B_PDL. For example, the electron transport area ETA may contact the side surface defining layer groves H2 defined in the side surface of the uneven pixel defining layer B_PDL. The electron transport area ETA may include protrusions coupled to the side surface defining layer grooves H2.

The electron transport area ETA may include at least one of a hole stop layer, an electron transport layer, and an electron injection layer, but is not limited thereto. For example, the electron transport area ETA may have a structure of the electron transport layer/the electron injection layer or the hole stop layer/the electron transport layer/the electron injection layer or a single layer structure in which at least two layers of the above-described layers are combined with each other, but is not limited thereto. The electron transport area ETA may be formed by using various methods, e.g., a vacuum deposition method, a spin coating method, a casting method, a Langmuir-Blodgett (LB) method, an inject printing method, a laser printing method, and a laser induced thermal imaging (LITI) method.

When the electron transport area ETA includes the electron transport layer, the electron transport area ETA may include Tris(8-hydroxyquinolinato)aluminum ($Alq_3$), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis (benzoquinolin-10-olate ($Bebq_2$), 9,10-di(naphthalene-2-yl) anthracene (ADN), and a mixture thereof, but is not limited thereto. The electron transport area ETA may have a thickness of about 100 Å to about 1,000 Å, e.g., about 150 Å to about 500 Å. When the electron transport layer has a thickness within the above-described range, satisfactory electron transport characteristics may be achieved without substantially increasing in driving voltage.

When the electron transport area ETA includes the electron injection layer, the electron transport area ETA may be formed of a lanthanum metal, e.g., at least one of LiF, Lithium quinolate (LiQ), $Li_2O$, BaO, NaCl, CsF, and Yb, or of a metal halide, e.g., at least one of RbCl and RbI. The electron injection layer may be formed of a mixture of the material for the electron transport material and an organo metal salt. The organo metal salt may be a material having an energy band gap of about 4 eV or more. For example, the organo metal salt may include metal acetate, metal benzoate, metal acetoacetate, metal acetylacetonate or metal stearate. The electron injection layer may have a thickness of about 1 Å to about 100 Å, e.g., about 3 Å to about 90 Å. When the electron injection layer has a thickness within the above-described range, satisfactory electron injection characteristics may be achieved without substantially increasing in driving voltage.

As described above, the electron transport area ETA may include the hole stop layer. For example, the hole stop layer may include at least one of 2,9-dimethyl-4,7-diphenyl-1,10-phenanthroline (BCP) and 4,7-diphenyl-1,10-phenanthroline (Bphen), but is not limited thereto. The hole stop layer may have a thickness of about 20 Å to about 1,000 Å, e.g., about 30 Å to about 300 Å. When the electron stop layer has a thickness within the above-described range, satisfactory electron stop characteristics may be achieved without substantially increasing in driving voltage.

The second electrode EL2 may be disposed on the first electrode EL1 and the uneven pixel defining layer B_PDL. The second electrode EL2 may be disposed on the electron transport area ETA. The second electrode EL2 may contact the electron transport area ETA and the top and side surfaces of the uneven pixel defining layer B_PDL.

The second electrode EL2 may include electrode grooves H3. The second electrode E12 may include an uneven second electrode EL2_B and an even second electrode EL2_N. The even second electrode EL2_N may extend from at least one end of the uneven second electrode EL2_B. The uneven second electrode EL2_B includes the electrode grooves H3. For example, the uneven second electrode EL2_B may contact the top surface of the uneven pixel defining layer B_PDL including the defining layer grooves H1 and H2.

The electrode grooves H3 may be spaced a predetermined interval from each other. For example, when viewed in the thickness direction DR3 of the display device 10 (from the top), the electrode grooves H3 may be defined to be spaced apart from each other in the first direction DR1 and the second direction DR2 crossing the first direction DR1. The electrode grooves H3 may have a uniform minimum distance at which the electrode grooves H3 are spaced apart from each other in the first direction DR1. The electrode grooves H3 may have a uniform minimum distance at which the electrode grooves H3 are spaced apart from each other in the second direction DR2. The minimum distance at which the electrode grooves H3 are spaced apart from each other in the first direction DR1 and the minimum distance at which the electrode grooves H3 are spaced apart from each other in the second direction DR2 may be the same or different from each other. The electrode grooves H3 may have a uniform depth. For example, the electrode grooves H3 may have a uniform depth in the thickness direction DR3 of the display device 10.

The even second electrode EL2_N may not include the electrode grooves H3. For example, the second even electrode EL2_N may contact the top surface of the electron transport area ETA.

The second electrode EL2 may be a common electrode or a negative electrode. The second electrode EL2 may be a transmissive electrode, a transflective electrode, or a reflective electrode.

When the second electrode EL2 is the transmissive electrode, the second electrode EL2 may include, e.g., Li, Ca, LiF/Ca, LiF/Al, Al, Mg, Ag or a compound or mixture (e.g., a mixture of Ag and Mg) thereof. The second electrode EL may include an auxiliary electrode. The auxiliary electrode may include a layer formed by depositing the above-described material toward the light emitting layer and transparent metal oxide on the layer, e.g., indium tin oxide (ITO), indium zinc oxide (IZO), zinc oxide (ZnO), or indium tin zinc oxide (ITZO).

When the second electrode EL2 is the transflective electrode or the reflective electrode, the second electrode EL2 may include, e.g., Ag, Mg, Al, Pt, Pd, Au, Ni, Nd, Ir, Cr, Li, Ca, LiF/Ca, LiF/Al, or a compound or mixture (e.g., a mixture of Ag and Mg) thereof. Alternatively, the second electrode EL2 may have a multi-layered structure including a reflective layer or transflective layer and a transparent conductive layer formed of indium tin oxide (ITO), indium zinc oxide (IZO), zinc oxide (ZnO), or indium tin zinc oxide (ITZO).

When the organic light emitting device OEL is a front light emitting type organic light emitting device, the first electrode EL1 may be the reflective electrode, and the second electrode EL2 may be the transmissive electrode or transflective electrode. When the organic light emitting device OEL is a rear light emitting type organic light emitting device, the first electrode EL1 may be the transmissive electrode or transflective electrode, and the second electrode EL2 may be the reflective electrode.

An encapsulation layer SL for covering the second electrode EL2 may be disposed on the second electrode EL2. The encapsulation layer SL may include an organic material or an inorganic material. The encapsulation layer SL protects the organic light emitting device OEL.

The display device according to an embodiment may include the uneven pixel defining layer with the defining layer grooves to induce color-mixing of the light emitted from the light emitting layer in the stacked direction of the plurality of layers and the light emitted from the light emitting layer in a lateral direction of the uneven pixel defining layer. Thus, in the display device according to an embodiment, color change due to the viewing angle may be reduced, and the side light may be efficiency utilized to improve light extraction efficiency.

Hereinafter, a method for fabricating the display device according to an embodiment will be described. Hereinafter, different points with respect to the display device according to the foregoing embodiment in FIGS. 1-4 will be mainly described, and thus, non-explained portions will be quoted from the display device according to the foregoing embodiment.

FIG. 5 is a schematic flowchart of a method for fabricating a display device according to an embodiment.

Referring to FIGS. 1 to 5, a method for fabricating the display device 10 according to an embodiment may include a process (S100) of forming the thin film transistors TFT1 and TFT2 on the base substrate BS, a process (S200) of forming the first electrode EL1 connected to the thin film transistors TFT1 and TFT2, a process (S300) of forming the pixel defining layer PDL that exposes a portion of the first electrode EL1 and partitions pixel areas PA, a process (S400) of forming the block copolymer layer BCPL on the first electrode EL1 and the pixel defining layer PDL, a process (S500) of patterning the block copolymer layer BCPL and etching the pixel defining layer PDL by using the patterned block copolymer layer BCPL as a mask to form the uneven pixel defining layer B_PDL including the plurality of defining layer grooves H1 and H2, and a process (S600) of forming a light emitting layer EML on the uneven pixel defining layer B_PDL.

FIGS. 6A to 6G and 6I illustrate cross-sectional views of stages in a method for fabricating the display device 10 according to an embodiment. FIG. 6H illustrates a schematic perspective view of the display device in FIG. 6G.

Referring to FIGS. 1 to 5 and 6A, the base substrate BS is prepared. In operation S100, the thin film transistors TFT1 and TFT2 are formed on the base substrate BS, followed by covering of the thin film transistors TFT1 and TFT2 by the passivation layer PL to define a substrate SUB. In operation S200, the first electrode EU is formed on the substrate SUB above the thin film transistors TFT1 and TFT2. The first electrode EL1 may not have grooves.

Referring to FIGS. 1 to 5 and 6B, in operation S300, a pixel defining layer PDL exposing a portion of the first electrode EL1 and partitioning pixel areas is formed on the substrate SUB. The pixel defining layer PDL overlaps a portion of the first electrode EU. The pixel defining layer PDL may include, but is not limited thereof, at least one of a polymer and a metal-fluorine ion compound. For example, the pixel defining layer PDL may be formed of one metal-fluorine ion compound of polyimide, LiF, $BaF_2$, and CsF. If the metal-fluorine ion compound has a predetermined thickness, the metal-fluorine ion compound may have an insulating property. For example, the pixel defining layer PDL may have a thickness of about 0.1 μm to about 10 μm.

Oxygen plasma processing may be performed on the pixel defining layer PDL. When the oxygen plasma processing is performed, an OH functional group may be generated on the pixel defining layer PDL.

Neutral layer processing and thermal processing may be performed on the pixel defining layer PDL on which the oxygen plasma processing is performed. The neutral layer processing and thermal processing may be performed on the pixel defining layer PDL without performing the oxygen plasma processing.

Referring to FIGS. 1 to 5 and 6C, in operation S400, the block copolymer layer BCPL is formed, e.g., conformally, on the first electrode EL1 and the pixel defining layer PDL. In operation (S400), the block copolymer layer BCPL may be any suitable material, e.g., at least one block copolymer of a polystyrene-polymethylmethacrylate copolymer, a polybutadiene-polybutylmethacrylate copolymer, a polybutadiene-polydimethylsiloxane copolymer, a polybutadiene-polymethylmethacrylate copolymer, a polybutadiene-polyvinylpyridine copolymer, a polybutylacrylate-polymethylmethacrylate copolymer, polybutylacrylate-polyvinylpyridine copolymer, a polyisoprene-polyvinylpyridine copolymer, a polyisoprenepolymethylmethacrylate copolymer, a polyhexylacrylate-polyvinylpyridine copolymer, a polyisobutylene-polybutylmethacrylate copolymer, a polyisobutylene-polymethylmethacrylate copolymer, a polyisobutylene-polybutylmethacrylate copolymer, a polyisobutylenepolydimethylsiloxane copolymer, a polybutylmethacrylatepolybutylacrylate copolymer, a polyethylethylene-polymethylmethacrylate copolymer, a polystyrene-polybutylmethacrylate copolymer, a polystyrene-polybutadiene copolymer, a polystyrene-polyisoprene copolymer, a polystyrene-polydimethylsiloxane copolymer, a polystyrene-polyvinylpyridine copolymer, a polyethylethylene-polyvinylpyridine copolymer, a polyethylene-polyvinylpyridine copolymer, a polyvinylpyridinepolymethylmethacrylate copolymer, a polyethyleneoxide-polyisoprene copolymer, a polyethyleneoxide-polybutadiene copolymer, a polyethyleneoxide-polystyrene copolymer, a polyethyleneoxidepolymethylmethacrylate copolymer, a (polyethyleneoxide-polydimethylsiloxane copolymer, and a polystyrene-polyethyleneoxide copolymer.

The block copolymer may include a linear or branched polymer having a molecular weight of several thousand g/mol to several million g/mol, e.g., about 3,000 g/mol to about 2,000,000 g/mol. The block copolymer may have any suitable shape, e.g., a diblock copolymer in which a first repeating unit (see reference symbol R1 of FIG. 6D) and a second repeating unit (see reference symbol R2 of FIG. 6D) are covalently bonded in the form of (first repeating unit)-co-(second repeating unit) or a triblock copolymer in which the first repeating unit and the second repeating unit are covalently bonded in the form of (first repeating unit)-co-(second repeating unit)-co-(first repeating unit). In another example, the block copolymer may include a triblock copolymer in which the first repeating unit, the second repeating unit, and a third repeating unit are covalently bonded in the form of (first repeating unit)-co-(second repeating unit)-co-(third repeating unit). However, embodiments are not limited thereto. For example, the block copolymer may include a multi-component block copolymer having various forms.

Referring to FIGS. 1 to 5, in operation S500, the block copolymer layer BCPL (FIG. 6C) is patterned, and then the pixel defining layer PDL is etched by using the pattern block copolymer as a mask to form the uneven pixel defining layer B_PDL having the defining layer grooves H1 and H2. In detail, operation S500 may include forming the uneven pixel defining layer B_PDL by patterning the block copolymer BCPL (of FIG. 6C) to form a block copolymer pattern BCP_P (FIG. 6E), and etching the pixel defining layer PDL (of FIG. 6C) by using the block copolymer pattern BCP_P as a mask to form the uneven pixel defining layer B_PDL having the defining layer grooves H1 and H2.

Figure 6E:
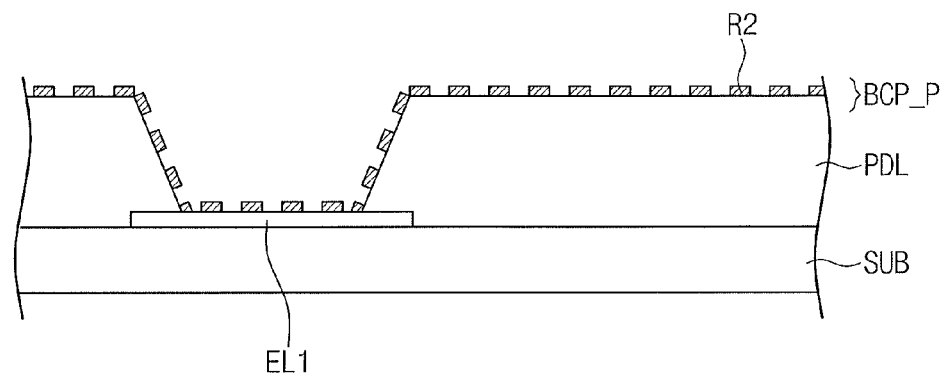
Figure 6F:
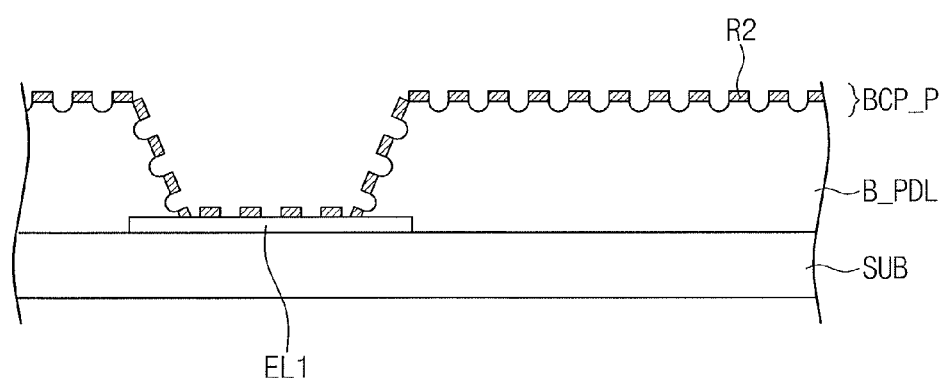
Figure 6G:
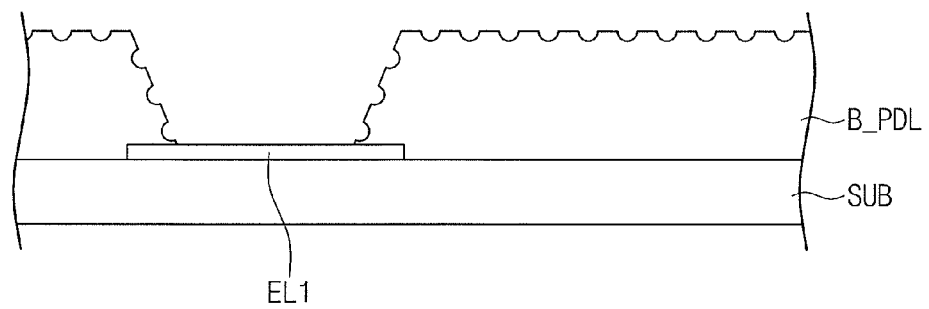
Figure 6H:
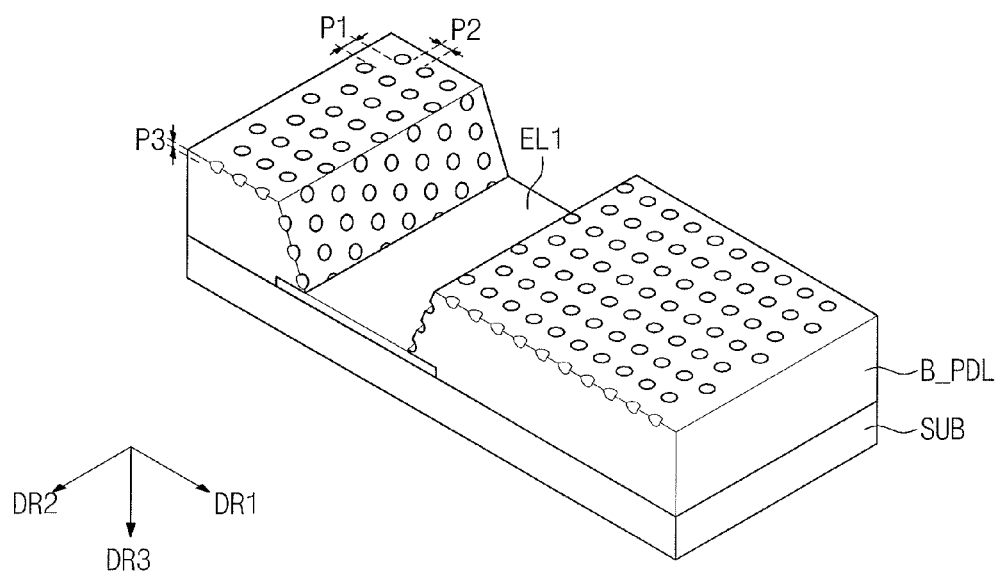
FIG. 6H illustrates a schematic perspective view of the display device in FIG. 6G.
Figure 6I:
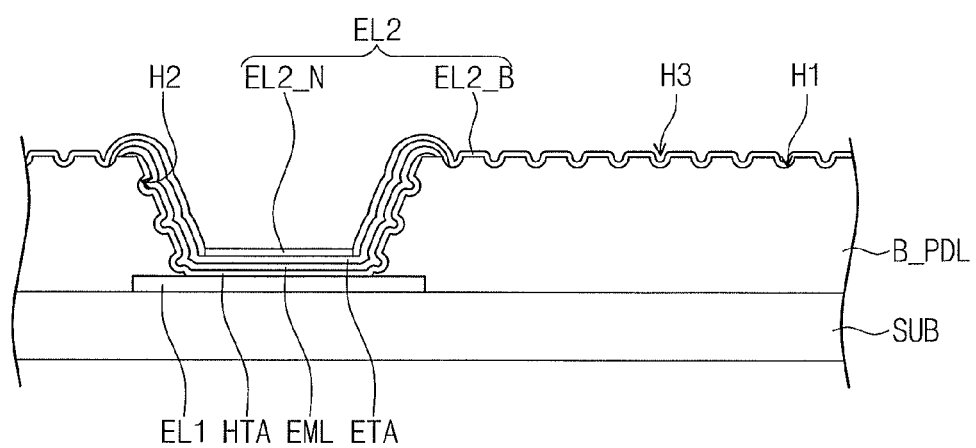

The process of forming the block copolymer pattern BCP_P may include a process of rearranging the first repeating units (see reference symbol R1 of FIG. 6D) and the second repeating units (see reference symbol R2 of FIG. 6D) to form a self-assembly structure (see reference symbol S_BCPL of FIG. 6D), in which the first repeating units (see reference symbol R1 of FIG. 6D) and the second repeating units (see reference symbol R2 of FIG. 6D) are alternately arranged, and a process of removing the first repeating units (see reference symbol R1 of FIG. 6D) to form the block copolymer pattern (see reference numeral BCP_P of FIG. 6E).

In detail, referring to FIGS. 1 to 5 and 6D, the first repeating units (see reference symbol R1 of FIG. 6D) and the second repeating units (see reference symbol R2 of FIG. 6D) may be rearranged to form the self-assembly structure (see reference symbol S_BCPL of FIG. 6D) in which the first repeating units (see reference symbol R1 of FIG. 6D) and the second repeating units (see reference symbol R2 of FIG. 6D) are alternately arranged. In the process of forming the self-assembly structure S_BCPL, the block copolymer may be self-assembled with various structures. For example, the block copolymer may be self-assembled with a sphere, cylinder, lamellar, gyroid, or hexagonal perforated cylinder (HPL) structure. The process of forming the self-assembly structure S_BCPL may be performed in any suitable manner, e.g., through thermal processing or solvent annealing.

Referring to FIGS. 1 to 5, 6D, and 6E, the first repeating units R1 are removed to form the block copolymer pattern BCP_P. For example, the block copolymer pattern BCP_P may not be etched to form the second repeating units R2 remaining on the first electrode EL1 and the pixel defining layer PDL. The block copolymer pattern BCP_P may be spaced a predetermined interval from each other.

In the process of forming the block copolymer pattern BCP_P, the first repeating units R1 may be etched to form the block copolymer pattern BCP_P. For example, the first repeating units R1 may be removed by dry etching or wet etching. In the process of forming the block copolymer pattern BCP_P, the process of etching the first repeating units R1 may be any suitable process, e.g., by providing at least one of ozone, oxygen, plasma, and UV.

Referring to FIGS. 1 to 5 and 6F, the pixel defining layer PDL is etched by using the second repeating units R2 as a mask. The pixel defining layer PDL may be etched by using the second repeating units R2 as a mask to form the uneven pixel defining layer B_PDL. In the process of etching the pixel defining layer PDL, the pixel defining layer PDL may be etched, and the first electrode EU may not be etched.

Referring to FIGS. 1 to 5, 6G, and 6H, a process of removing the second repeating units R2 remaining on the first electrode EL1 and the uneven pixel defining layer B_PDL may be performed. For example, the second repeating units R2 may be removed by dry or wet etching. Any suitable process for removing the second repeating units R2 maybe sued, e.g., providing at least one of ozone, oxygen plasma, and UV.

The uneven pixel defining layer B_PDL includes a plurality of defining layer grooves H1 and H2. The defining layer grooves H1 and H2 include top surface defining layer grooves H1 defined in a top surface of the uneven pixel defining layer B_PDL, and side surface defining layer grooves H2 defined in a side surface of the uneven pixel defining layer B_PDL. The defining layer grooves H1 and H2 are not defined in a bottom surface of the uneven pixel defining layer B_PDL.

The defining layer grooves H1 and H2 may be spaced a predetermined interval from each other. For example, when viewed in the thickness direction DR3 of the display device 10 (from top view), the defining layer grooves H1 and H2 may be defined to be spaced apart from each other in the first direction DR1 and the second direction DR2 crossing the first direction DR1. The defining layer grooves H1 and H2 may have a uniform minimum distance P1 in which the defining layer grooves H1 and H2 are spaced apart from each other in the first direction DR1. The defining layer grooves H1 and H2 may have a uniform minimum distance P2 in which the defining layer grooves H1 and H2 are spaced apart from each other in the second direction DR1.

For example, each of the minimum distance P1 at which the defining layer grooves H1 and H2 are spaced apart from each other in the first direction DR1, and the minimum distance P2 at which the defining layer grooves H1 and H2 are spaced apart from each other in the second direction DR2 may be about 5 nm to about 1,000 nm. When each of the minimum distance P1, at which the defining layer grooves H1 and H2 are spaced apart from each other in the first direction DR1, and the minimum distance P2, at which the defining layer grooves H1 and H2 are spaced apart from each other in the second direction DR2, is about 5 nm or less, it may be difficult to control the process due to the short distance between the defining layer grooves H1 and H2. On the other hand, when each of the minimum distance P1, at which the defining layer grooves H1 and H2 are spaced apart from each other in the first direction DR1, and the minimum distance P2, at which the defining layer grooves H1 and H2 are spaced apart from each other in the second direction DR2, is greater than about 1,000 nm, it may be difficult to sufficiently induce the color-mixing of the light emitted from the light emitting layer in the stacked direction of the plurality of layers and the light emitted from the light emitting layer in the lateral direction of the uneven pixel defining layer due to the long distance between the defining layer grooves H1 and H2.

Although the minimum distance P1, at which the defining layer grooves H1 and H2 are spaced apart from each other in the first direction DR1, and the minimum distance P2, at which the defining layer grooves H1 and H2 are spaced apart from each other in the second direction DR2, are the same in FIG. 6H, the present disclosure is not limited thereto. For example, the minimum distance P1, at which the defining layer grooves H1 and H2 are spaced apart from each other in the first direction DR1, and the minimum distance P2, at which the defining layer grooves H1 and H2 are spaced apart from each other in the second direction DR2, may be different from each other.

The defining layer grooves H1 and H2 may have a uniform depth. For example, the defining layer grooves H1 and H2 may have a uniform depth in the thickness direction DR3 of the display device 10. The defining layer grooves H1 and H2 may have a depth of, e.g., about 5 nm to about 1,000 nm. When each of the defining layer grooves H1 and H2 has a depth of about 5 nm or less, it may be difficult to control the process due to the short distance between the defining layer grooves. On the other hand, when each of the defining layer grooves H1 and H2 has a depth greater than about 1,000 nm, it may be difficult to sufficiently induce the color-mixing of the light emitted from the light emitting layer in the stacked direction of the plurality of layers and the light emitted from the light emitting layer in the lateral direction of the uneven pixel defining layer due to the long distance between the defining layer grooves H1 and H2.

If the defining layer grooves are formed by using a general photolithography process, it may be difficult to form a fine structure having a size similar to that of a molecule. However, in the display device according to an embodiment, the fine defining layer grooves, each of which has a size similar to that of a molecule, may be formed by using the block copolymer. Also, the defining layer grooves that are defined to be spaced a predetermined interval from each other may be formed through a relatively simple process.

Referring to FIGS. 1 to 5 and 6I, in operation S600, the block copolymer layer BCPL is formed on the first electrode EL1 and the pixel defining layer PDL. The light emitting layer EML may be disposed on the first electrode EL1. The light emitting layer EML may be disposed on the hole transport area HTA.

The light emitting layer EML may contact the uneven pixel defining layer B_PDL. For example, the light emitting layer EML may contact the side surface defining layer groves H2 defined in the side surface of the uneven pixel defining layer B_PDL. Although not shown, the light emitting layer EML may extend to contact top surface defining layer grooves H1 disposed on the top surface of the uneven pixel defining layer B_PDL.

The method for fabricating the display device 10 according to an embodiment may further include a process of forming a second electrode EL2 on the uneven pixel defining layer B_PDL and the light emitting layer EML. The second electrode EL2 may be disposed on the first electrode EL1 and the uneven pixel defining layer B_PDL. The second electrode EL2 may be disposed on the electron transport area HTA disposed on the light emitting layer EML.

The second electrode EL2 may include the electrode grooves H3. The second electrode EL2 may include the uneven second electrode EL2_B and the even second electrode EL2_N. The even second electrode EL2_N may extend from at least one end of the uneven second electrode EL2_B. The uneven second electrode EL2_B includes the electrode grooves H3. For example, the uneven second electrode may contact the top surface of the uneven pixel defining layer B_PDL including the defining layer grooves H1 and H2.

The electrode grooves H3 may be spaced a predetermined interval from each other. For example, when viewed in the thickness direction DR3 of the display device 10, the electrode grooves H3 may be defined to be spaced apart from each other in the first direction DR1 and the second direction DR2 crossing the first direction DR1. The electrode grooves H3 may have a uniform minimum distance in which the electrode grooves H3 are spaced apart from each other in the first direction DR1. The electrode grooves H3 may have a uniform minimum distance at which the electrode grooves H3 are spaced apart from each other in the second direction DR2. The minimum distance at which the electrode grooves H3 are spaced apart from each other in the first direction DR1 and the minimum distance at which the electrode grooves H3 are spaced apart from each other in the second direction DR2 may be the same or different from each other. The electrode grooves H3 may have a uniform depth in the thickness direction DR3 of the display device 10.

The even second electrode EL2_N may not include the electrode grooves H3. For example, the second even electrode EL2_N may contact the top surface of the electron transport area ETA.

If the defining layer grooves are formed by using a general photolithography process, it may be difficult to form a fine structure having a size similar to that of a molecule. However, in the display device according to an embodiment, the uneven pixel defining layer having fine defining layer grooves, each of which has a size similar to that of a molecule, may be formed by using the block copolymer. Also, the defining layer grooves that are defined to be spaced a predetermined interval from each other may be formed through a relatively simple process.

The display device and method of fabrication thereof according to an embodiment may include the uneven pixel defining layer with the defining layer grooves, thereby inducing color-mixing of the light emitted from the light emitting layer in the stacked direction of the plurality of layers and the light emitted from the light emitting layer in a lateral direction of the uneven pixel defining layer. Thus, in the display device according to an embodiment, a color change due to the viewing angle may be reduced, and the side light may be efficiency utilized to improve light extraction efficiency. As such, the display device according to an embodiment may exhibit improved display quality, and the method for fabricating the display device may be simplified.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a display device, the method comprising:

forming a thin film transistor on a base substrate;

forming a first electrode connected to the thin film transistor;

forming a pixel defining layer overlapping a portion of the first electrode, such that the pixel defining layer exposes a portion of the first electrode and partitions pixel areas;

forming a block copolymer layer on the first electrode and the pixel defining layer;

patterning the block copolymer layer;

etching the pixel defining layer by using the patterned block copolymer layer as a mask, such that an uneven pixel defining layer with a plurality of defining layer grooves is formed; and forming a light emitting layer on the first electrode and the uneven pixel defining layer.

2. The method as claimed in claim 1, wherein forming the uneven pixel defining layer includes forming the defining layer grooves therein to be spaced a predetermined interval from each other.

3. The method as claimed in claim 1, wherein forming the uneven pixel defining layer includes forming the defining layer grooves therein to have a uniform depth.

4. The method as claimed in claim 1, wherein forming the uneven pixel defining layer includes forming the defining layer grooves in a top surface of the uneven pixel defining layer, such that no defining layer grooves are formed in a bottom surface of the uneven pixel defining layer.

5. The method as claimed in claim 1, wherein forming the uneven pixel defining layer includes:

patterning the block copolymer layer to form a block copolymer pattern; and etching the pixel defining layer by using the block copolymer pattern as a mask to form the uneven pixel defining layer having the defining layer grooves.

6. The method as claimed in claim 5, wherein forming the block copolymer pattern is performed by providing ozone, oxygen plasma, or UV.

7. The method as claimed in claim 5, wherein forming the block copolymer layer is performed by using a block copolymer including first repeating units and second repeating units different from the first repeating units.

8. The method as claimed in claim 7, wherein forming the block copolymer pattern includes:

rearranging the first repeating units and the second repeating units to form a self-assembly structure in which the first repeating units and the second repeating units are alternately arranged; and removing the first repeating units to form the block copolymer pattern.

9. The method as claimed in claim 8, wherein forming the self-assembly structure is performed through thermal processing or solvent annealing.

10. The method as claimed in claim 8, wherein, in the forming of the self-assembly structure, the block copolymer is self-assembled with a sphere, a cylinder, a lamellar, a gyroid, or a hexagonal perforated cylinder (HPL) structure.

11. The method as claimed in claim 8, wherein forming the uneven pixel defining layer includes:

etching the pixel defining layer by using the second repeating units as a mask; and removing the second repeating units.

12. The method as claimed in claim 11, wherein etching the pixel defining layer includes etching the pixel defining layer without etching the first electrode.

13. The method as claimed in claim 11, wherein removing the second repeating units includes removing the second repeating units disposed on the first electrode and the uneven pixel defining layer.

14. The method as claimed in claim 1, wherein forming the uneven pixel defining layer includes exposing the portion of the first electrode.

15. The method as claimed in claim 1, wherein forming the first electrode is performed so that the first electrode does not have grooves.

16. The method as claimed in claim 1, further comprising
forming a second electrode on the uneven pixel defining layer and the light emitting layer, such that the second electrode includes an uneven second electrode with electrode grooves, and an even second electrode extending from the uneven second electrode and having no electrode grooves.

17. A display device, comprising:
a base substrate; and
a plurality of pixels on the base substrate, at least one pixel of the plurality of pixels including:
a thin film transistor on the base substrate,
a first electrode connected to the thin film transistor,
an uneven pixel defining layer overlapping a portion of the first electrode, the uneven pixel defining layer having a plurality of defining layer grooves,
a light emitting layer on the first electrode and the uneven pixel defining layer, and
a second electrode having an uneven second electrode with electrode grooves, and an even second electrode extending from the uneven second electrode and having no electrode grooves, the second electrode being disposed on the light emitting layer, wherein the uneven pixel defining layer includes an upper side surface and side surfaces defining an opening overlapping the light emitting layer, wherein the defining layer grooves include first defining layer grooves disposed on the upper side surface and second defining layer grooves disposed on the side surfaces, wherein the electrode grooves are disposed on an upper surface and a lower surface of the uneven second electrode, and wherein the electrode grooves do not overlap the light emitting layer.

18. The display device as claimed in claim 17, wherein the first electrode does not have grooves.

19. The display device as claimed in claim 17, wherein the defining layer grooves are defined in a top surface of the uneven pixel defining layer and are not defined in a bottom surface of the uneven pixel defining layer.

20. The display device as claimed in claim 17, wherein the defining layer grooves are only on surfaces of the pixel defining layer facing the second electrode, the defining layer grooves being spaced apart from each other and having a predetermined depth in the pixel defining layer.

21. The display device as claimed in claim 17, wherein the pixel defining layer has substantially flat surfaces between respective pairs of the defining layer grooves.

22. The display device as claimed in claim 21, wherein the flat surfaces extend beyond bottom surfaces of the defining layer grooves.

23. The display device as claimed in claim 17, wherein the light emitting layer is on the defining layer grooves and has an uneven surface that substantially conforms to the defining layer grooves.

* * * * *